(12) United States Patent
Oyer et al.

(10) Patent No.: US 10,418,510 B1
(45) Date of Patent: Sep. 17, 2019

(54) MESA SHAPED MICRO LIGHT EMITTING DIODE WITH ELECTROLESS PLATED N-CONTACT

(71) Applicant: Facebook Technologies, LLC, Menlo Park, CA (US)

(72) Inventors: Celine Claire Oyer, Cork (IE); Allan Pourchet, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 15/853,505

(22) Filed: Dec. 22, 2017

(51) Int. Cl.
*H01L 33/00* (2010.01)
*H01L 33/38* (2010.01)
*H01L 33/06* (2010.01)

(52) U.S. Cl.
CPC ............ *H01L 33/005* (2013.01); *H01L 33/06* (2013.01); *H01L 33/38* (2013.01)

(58) Field of Classification Search
CPC ........ H01L 33/005; H01L 33/06; H01L 33/38
See application file for complete search history.

(56) References Cited

U.S. PATENT DOCUMENTS

| 6,410,942 | B1 | 6/2002 | Thibeault et al. | |
|---|---|---|---|---|
| 7,411,220 | B2 * | 8/2008 | Horio | H01L 33/08 257/79 |
| 7,511,311 | B2 * | 3/2009 | Kususe | H01L 24/06 257/95 |
| 7,518,149 | B2 | 4/2009 | Maaskant et al. | |
| 7,595,514 | B2 * | 9/2009 | Lai | H01L 33/22 257/103 |
| 8,805,131 | B2 * | 8/2014 | Shiraishi | G02B 6/4214 385/14 |
| 9,608,171 | B2 * | 3/2017 | Chae | H01L 25/0753 |
| 9,768,357 | B2 * | 9/2017 | Gaska | H01L 33/32 |
| 9,769,897 | B2 * | 9/2017 | Song | H05B 33/0845 |
| 2006/0145164 | A1 | 7/2006 | Illek et al. | |

(Continued)

FOREIGN PATENT DOCUMENTS

| CN | 105336734 A | 2/2016 |
|---|---|---|
| EP | 1821347 A2 | 8/2007 |

(Continued)

OTHER PUBLICATIONS

Quirk et al., Semiconductor Manufacturing Technology, 2001, Prentice-Hall, New Jersey, p. 438-439, Etch (Year: 2001).*

(Continued)

*Primary Examiner* — Nikolay K Yushin
(74) *Attorney, Agent, or Firm* — Fenwick & West LLP

(57) ABSTRACT

A method for fabricating a light emitting diode (LED) with a first electrical contact deposited around the side of a layered mesa structure. First, layers of materials are formed. The layers of materials include a first semiconductor layer, a second semiconductor layer, and a light emitting layer between the first and second semiconductor layers for producing light responsive to passing current through the light emitting layer. The formed layers of material are shaped to include a bottom surface, a top surface, and at least one side surface extending from the bottom surface to the top surface. The top surface has a smaller area than the bottom surface. An electrical contact is deposited on the at least one side surface.

19 Claims, 6 Drawing Sheets

(56) References Cited

U.S. PATENT DOCUMENTS

| | | | |
|---|---|---|---|
| 2006/0231852 A1* | 10/2006 | Kususe | H01L 24/06 |
| | | | 257/99 |
| 2008/0135864 A1 | 6/2008 | David et al. | |
| 2008/0224153 A1 | 9/2008 | Tomoda | |
| 2009/0020781 A1* | 1/2009 | Lai | H01L 33/22 |
| | | | 257/103 |
| 2012/0002915 A1* | 1/2012 | Shiraishi | G02B 6/4214 |
| | | | 385/14 |
| 2013/0020589 A1 | 1/2013 | Yu et al. | |
| 2015/0270442 A1* | 9/2015 | Chae | H01L 25/0753 |
| | | | 257/88 |
| 2015/0372192 A1 | 12/2015 | Epler | |
| 2016/0155913 A1 | 6/2016 | Maki | |
| 2016/0172544 A1* | 6/2016 | Gaska | H01L 33/32 |
| | | | 257/13 |
| 2017/0071042 A1* | 3/2017 | Song | H05B 33/0845 |

FOREIGN PATENT DOCUMENTS

| | | | | |
|---|---|---|---|---|
| JP | H0818105 A | | 1/1996 | |
| WO | WO 2016/209025 | * | 12/2016 | G09G 3/34 |

OTHER PUBLICATIONS

Quirk et al., Semiconductor Manufacturing Technology, 2001, Prentice-Hall, New Jersey, p. 264, Table 11.1, Film Deposition (Year: 2001).*

Extended European Search Report, European Patent No. 18196612, dated Feb. 22, 2019, 9 pages.

PCT International Search Report and Written Opinion, PCT Application No. PCT/US2018/049962, dated Mar. 21, 2019, 26 pages.

* cited by examiner

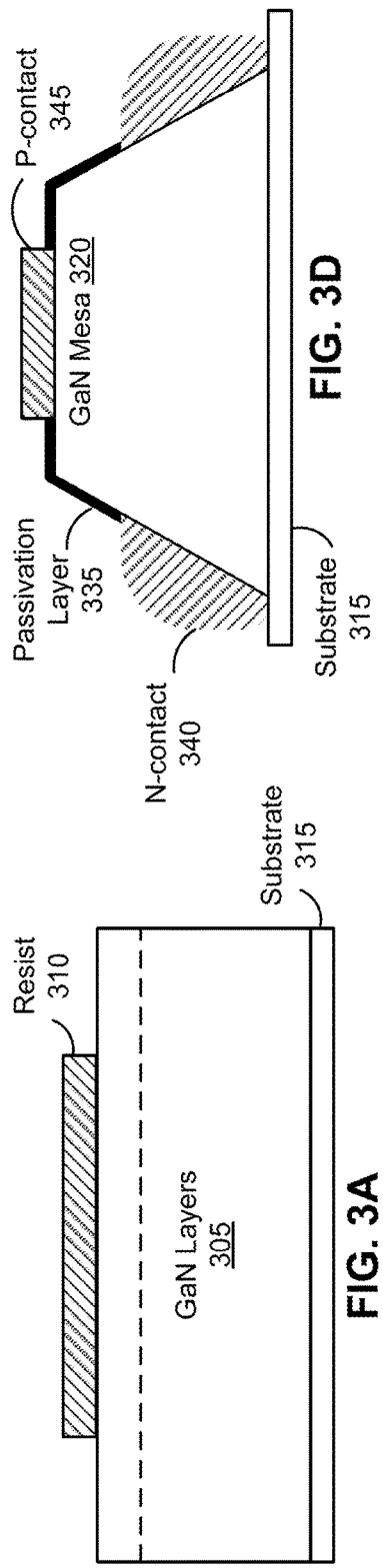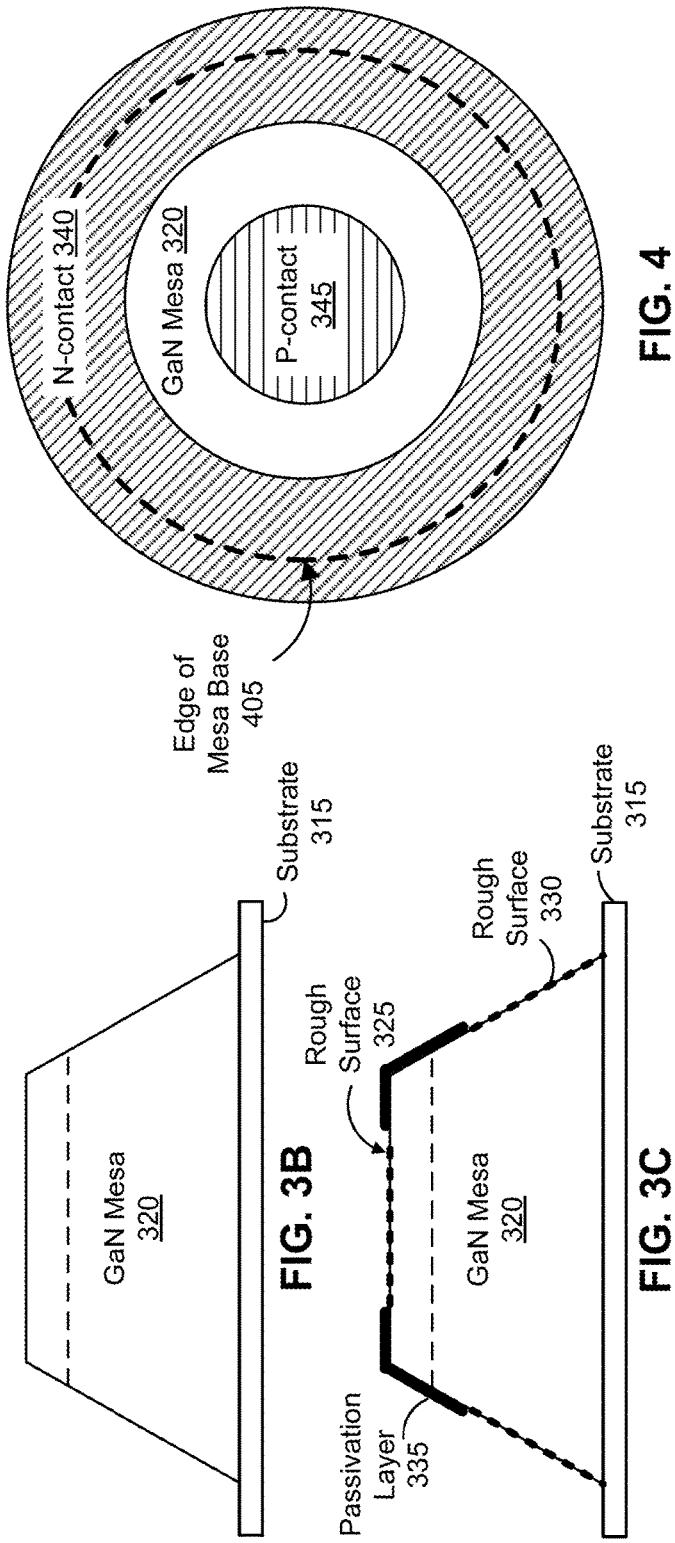

MESA SHAPED MICRO LIGHT EMITTING DIODE WITH ELECTROLESS PLATED N-CONTACT

BACKGROUND

This disclosure relates to a mesa shaped micro light emitting diode (LED) with the N-contact formed around the base of a mesa.

LEDs convert electrical energy into optical energy. In semiconductor LEDs, light is usually generated through recombination of electrons, originating from an n-type doped semiconductor layer, and holes originating from a p-type doped semiconductor layer. As used herein, the term "light" includes not just visible light, but also electromagnetic radiation having a wavelength outside that of the visible range, including infrared and ultraviolet radiation.

Prior bottom-emitting micro-LEDs ("μLEDs") have a p-contact and an n-contact both formed on the top side of the μLED. In some cases, the p-contact is formed on top of a mesa structure that includes a p-type layer, a quantum well, and an n-type layer. The n-type layer extends beyond the mesa structure, and the n-contact is formed on top of this extended portion of the n-type layer. A transistor layer, such as a thin film transistor (TFT) layer, connects to the p-contact and the n-contact. The transistors apply a voltage difference between the n-contact and the p-contact which causes current to flow between the contacts and light to emit from the quantum well. The light is emitted through the bottom side of the μLED, opposite the electrical contacts and the transistor layer.

SUMMARY

Embodiments relate to fabricating a light emitting diode (LED) with a first electrical contact deposited around the side of a layered mesa structure. Layers of materials are formed. The layers of materials include a first semiconductor layer, a second semiconductor layer, and a light emitting layer between the first and second semiconductor layers for producing light responsive to passing current through the light emitting layer. The formed layers of material are shaped to include a bottom surface, a top surface, and at least one side extending from the bottom surface to the top surface. The top surface has a smaller area than the bottom surface. An electrical contact is deposited on the at least one side.

In some embodiments, the first electrical contact is deposited using an electroless plating process. This electroless plating process may also be used to deposit a second electrical contact on the top surface; the top surface may first be roughened by dry etching, wet etching, or annealing.

In some embodiments, an etching process individuates the formed layers when shaping the formed layers of materials. The etching process may also roughen a portion of the at least one side; the first electrical contact is deposited on this roughened portion. The etching process may etch the layers of materials into a mesa, and the side that goes around the mesa is the at least one side on which the first electrical contact is deposited.

In some embodiments, the layers are formed on a fabrication substrate, and the first electrical contact is deposited with the bottom surface attached to a fabrication substrate. The fabrication method may further include detaching the shaped layers of material with the first electrical contact from the fabrication substrate. The fabrication method may further involve aligning the detached layers of material to a circuitry substrate, and connecting the first electrical contact to a contact pad on the circuitry substrate. The circuitry substrate may be transparent.

Embodiments also relate to LED including layers of material, which include a first semiconductor layer, a second semiconductor layer, and a light emitting layer between the first semiconductor layer and the second semiconductor layer for producing light responsive to passing current through the light emitting layer. The top semiconductor layer has a bottom surface, and the second semiconductor layer has a tip surface. A first electrical contact encircles the first semiconductor layer.

In some embodiments, the layers of material may be formed into a mesa shape. The first electrical contact may be proximate to the bottom surface of the first semiconductor layer, and it may be deposited by an electroless plating process. At least one side surface of the layers of material may be roughened so that the first electrode is selectively deposited on the at least one side surface.

In some embodiments, the bottom surface of the first layer may have a non-circular shape. The LED may include a second electrical contact on the top surface. The first semiconductor layer may include an upper portion and a lower portion, and the first electrical contact may be in contact with and encircling the lower portion of the first semiconductor layer, while the second electrical contact is not in contact with and does not encircle the upper portion of the first semiconductor layer. A circuitry substrate having a first contact pad may be connected to the first electrical contact.

BRIEF DESCRIPTION OF DRAWINGS

FIG. 3A-3D are a series of cross sectional diagrams showing the process of fabricating a μLED with electroless plated contacts, according to one embodiment.

FIG. 4 is a top view of the μLED shown in FIG. 3D, according to one embodiment.

DETAILED DESCRIPTION

Embodiments relate to a mesa-shaped bottom-emitting micro LED, or "μLED," that has an n-contact formed around the base of the μLED structure. The n-contact of the μLED is formed directly around the base of the light-emitting semiconductor structure, rather than being formed as a separate structure spaced away from the light-emitting structure. In this way, the µLED structure increases the amount of light extracted relative to size of the µLED, and increases the density of µLEDs in arrangements with multiple µLED devices. Embodiments also relate to a process of producing these µLEDs that reduces cost, time, and complexity of production.

Figure 1:
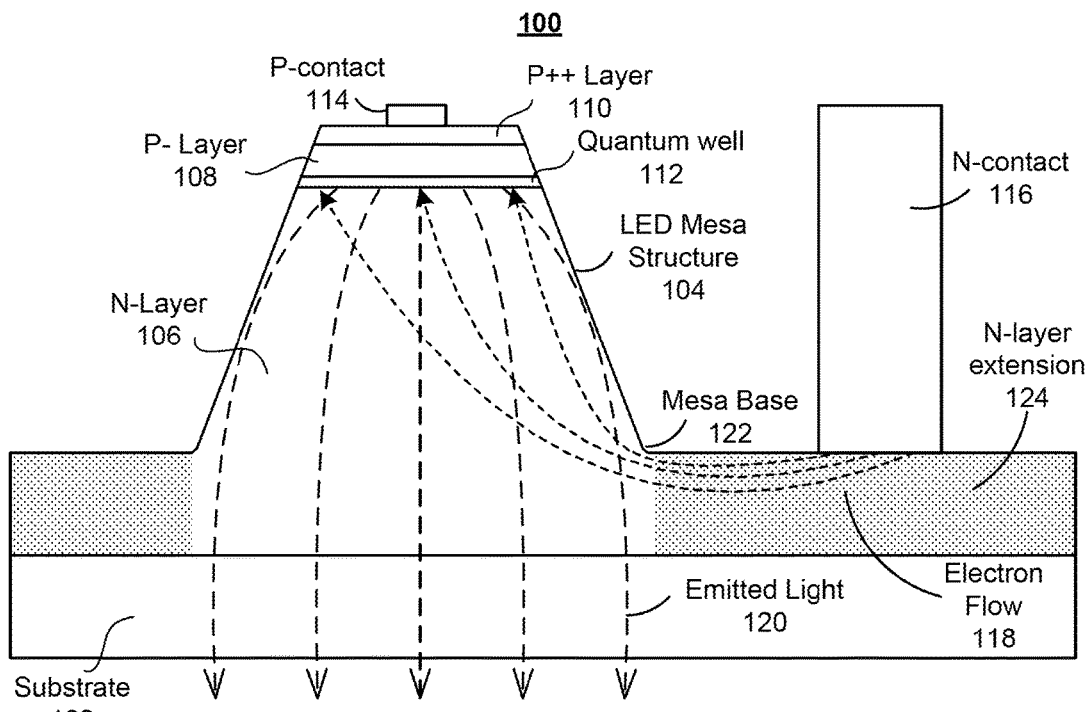
FIG. 1 is a cross sectional diagram of a μLED with a mesa shaped structure.

FIG. 1 is a cross sectional diagram of a conventional bottom-emitting mesa shaped µLED 100. A µLED, or "Micro LED," refers to a particular type of LED having a small active light emitting area (e.g., less than 2,000 µm$^2$). Bottom-emitting µLEDs emit light through a bottom surface of the µLED. The bottom surface typically has an emitting area, which refers herein to an area of the bottom surface through light is emitted during operation of the µLED, and a non-emitting area, which refers herein to an area of the bottom surface through which light is not emitted during operation of the µLED.

During manufacture, the µLED 100 is formed on a substrate 102 (also known as "fabrication substrate"), such as a sapphire substrate. An LED mesa structure 104 is formed above the substrate 102. The LED mesa structure 104 is made up of several semiconductor layers: an n-layer 106, a p-layer 108, and a p++ layer 110. The n-layer 106 is an n-type semiconductor, such as n-type gallium nitride ("N-GaN"), and the p-layer 108 and p++ layer 110 are a p-type semiconductor, such as p-type gallium nitride ("P-GaN" and "P++ GaN"). The p++ layer 110 has a higher doping concentration than the p-layer 108. In some embodiments, only one p-type layer with a single concentration is used instead of providing both a p-layer 108 and a p++ layer 110. A quantum well 112 is formed between the p-layer 108 and the n-layer 106. The quantum well emits light when excited by a current.

As shown in FIG. 1, the semiconductor layers 106, 108, and 110 and the quantum well 112 are formed into a semi-parabolic mesa shape 104. The mesa structure 104 has a mesa base 122, which may be circular. The n-layer 106 extends below the mesa base 122 and around the diameter of the mesa base 122. The extension of the n-layer 106 beyond the diameter of the mesa base 122 is shown as the shaded n-layer extension region 124 in FIG. 1.

A p-contact 114 is formed on the top of the mesa, connecting to the p++ layer 110. An n-contact 116 is formed on the n-layer extension 124 of the n-layer 106. Contact pads can be attached to both the n-contact 116 and the p-contact 114 to connect the µLED 100 to a transistor layer, such as a thin film transistor (TFT) layer (not shown). In addition, the µLED 100 can be removed from the substrate 102 and placed on a transparent layer, such as glass.

During operation of the µLED 100, a voltage difference is applied between the n-contact 116 and the p-contact 114 so that electrons flow from the n-contact 116 towards the p-contact 114. The arrows 118 show the path of the electron flow along the n-layer extension 124 of the n-layer 106 towards the mesa structure 104, and up through the mesa structure 104 to the quantum well 112. As a result, light is emitted from the quantum well 112 and the light passes through the n-type semiconductor 106 and the transparent layer. The arrows 120 show the direction of the emitted light.

The mesa structure 104 has a truncated top, on a side opposed to a light transmitting or emitting face of the µLED 100. The mesa 104 has a near-parabolic shape to form a reflective enclosure for light generated within the µLED 100. When the light emitted from the quantum well 112 reflects off of the walls of the mesa structure 104 and/or the p-contact 114, the µLED 100 outputs collimated or quasi-collimated light that has a reduced beam angle compared to light emitted from a standard unfocused LED device. Collimating the light is beneficial because it increases the brightness level of light emitted from the small active light emitting area and prevents the spreading of emitted light into the beampath of other adjacent µLEDs or photodetectors.

As shown in FIG. 1, light is only emitted in the region under the LED mesa structure 104. No light is emitted in the area of the n-layer extension 124, on which the n-contact 116 is formed. When multiple µLEDs 100 are positioned together, the amount of light extracted relative to the size of the bottom surface of the µLEDs 100, and the density of the light-emitting portions of the µLEDs 100, is limited by size of the non-emitting area used for the n-contacts 116 of the µLEDs 100. In addition, the electron flow 118 encounters resistance between the n-contact 116 and the quantum well 112. A lower resistance within the device would improve the operation of the µLED 100.

Figure 2:
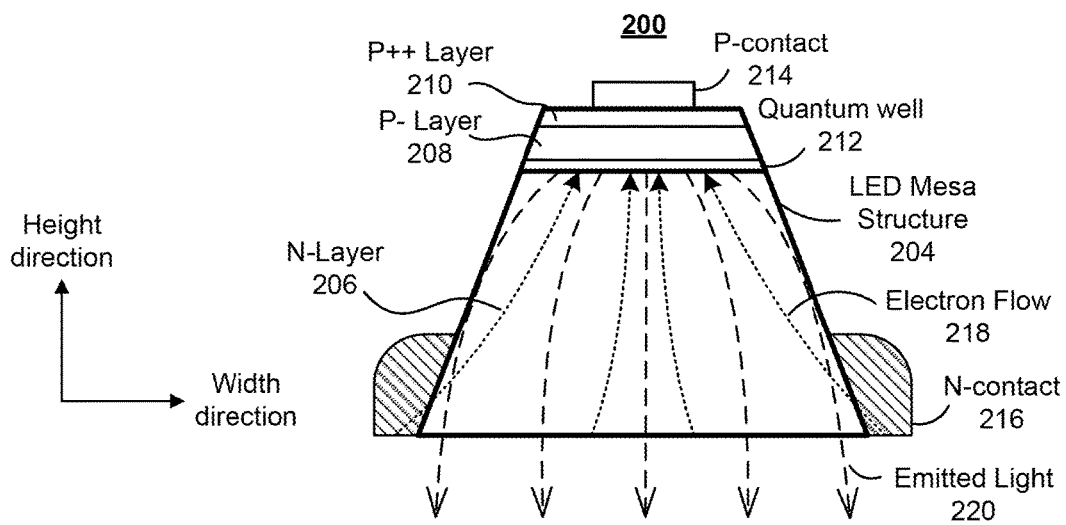
FIG. 2 is a cross sectional diagram of a μLED with an electrical contact formed around the side of the mesa structure, according to one embodiment.

FIG. 2 is a cross sectional diagram of a µLED 200 with an electrical contact formed around the side of the mesa structure, according to one embodiment. The n-contact in the µLED 200 is formed around the lower portion of the LED mesa structure, rather than separate and set away from the LED mesa structure, thus eliminating the need to have the n-layer extend beyond the diameter of the mesa structure for forming the n-contact.

The µLED 200 includes an LED mesa structure 204, a p-contact 214 disposed on the top of the LED mesa structure 204, and an n-contact 216 disposed along the side of the LED mesa structure 204. The n-contact 216 encircles the side of the LED mesa structure 204 in the region around the base of the LED mesa structure 204. The LED mesa structure 204 includes an n-layer 206, a p-layer 208, a p++ layer 210, and a quantum well 212. The p++ layer 210 is in contact with the p-contact 214, and the n-layer 206 is in contact with the n-contact 216. The quantum well 212 emits light when a voltage difference is applied between the p-contact 214 and the n-contact 216, causing a current to pass through the LED mesa structure 204. The arrows 218 show the path of the electron flow from the n-contact 216 and the n-layer 206 to the quantum well 212. The µLED 200 may be partially coated by a passivation layer that extends between the n-contact 216 and the p-contact 214; the passivation layer is not shown in FIG. 2.

Light is emitted from the quantum well 212 and through the n-layer 206. The arrows 220 show the direction of the emitted light. The elements of the LED mesa structure 204 (i.e., the n-layer 206, the p-layer 208, the p++ layer 210, and the quantum well 212) and the p-contact 214 are similar to the corresponding elements of the LED mesa structure 104 and the p-contact 114 described with respect to FIG. 1. In addition, the LED mesa structure 204 has a similar semi-parabolic shape to the LED mesa structure 104 described with respect to FIG. 1, and the µLED 200 outputs collimated or quasi-collimated light. The base of the LED mesa structure 204 may be circular, oblong, or have some other shape. In some embodiments, the LED mesa structure 204 is formed by growing the layers in order from the n-layer 206 upwards. In such embodiments, the n-layer 206 is grown first, followed by a quantum well layer 212, the p-layer 208, and the p++ layer 210. The p++ layer 210 is optional, and a single p-layer may alternatively be used. In some embodiments, additional layers are included, such as an electron blocking layer or a strain release layer. After the layers are grown, the mesa structure 204 is etched. After the etching, the n-contact 216 and p-contact 214 are deposited on the mesa structure 204. This process is described in further detail in relation to FIGS. 3A-3D.

The n-contact 216 of the μLED 200 is formed directly on the LED mesa structure 204, around the side at the base of the mesa. Because the n-contact 216 is formed directly on the LED mesa structure 204, the n-layer 206 does not extend beyond the diameter of the bottom of the LED mesa structure 204, contrary to FIG. 1. Instead, the layers of material in the LED mesa structure 204, including the n-layer 206, are etched all the way through during the shaping of the LED mesa structure 204. This individuates the mesa structure 204 from neighboring mesa structures formed on the same substrate.

The n-contact 216 and p-contact 214 can be deposited using an electroless plating process, which is described with respect to FIG. 3. The electroless plating process is performed while the LED mesa structure 204 is attached to the substrate on which the structure 204 is fabricated; the position of the substrate causes the bottom of the n-contact 216 to be in the same plane as the bottom of the LED mesa structure 204. This allows the μLED 200 to be placed directly on a contact pad of a transistor layer, such as a transparent thin film transistor (TFT), as described below in detail with reference to FIG. 5. The n-contact 216 may have a different size or shape from the n-contact 216 shown in FIG. 2; for example, the n-contact 216 may be thicker or thinner, and the n-contact may extend higher up on the n-layer 206.

Forming the n-contact 216 directly on the side of the LED mesa structure 204 and not including the n-layer extension (shown in FIG. 1) reduces the size of the bottom surface of the μLED 200 compared to the μLED 100 in FIG. 1. The area of the n-contact 216 does extend outside the area of the base of the LED mesa structure 204, but an overall area for the n-contact 216 is smaller than for the separated n-contact 116 on the μLED 100 of FIG. 1.

In addition to the reduced size of the μLED 200, one of many other advantages to the configuration of the μLED 200 over the μLED 100 is that the resistance between the n-contact 216 and the quantum well 212 (i.e., the resistance in the n-layer 216) of FIG. 2 is less than the resistance between the n-contact 116 and the quantum well 112 (i.e., the resistance in the n-layer 116) of FIG. 1. There are several reasons that the resistance in the n-layer 206 is lower. First, the distance that the electrons travel between the n-contact 116 and the quantum well 112 in μLED 100 is longer than the distance that the electrons travel between the n-contact 216 and the quantum well 212 in μLED 200, which makes the resistance of the n-layer 106 greater than the resistance of the n-layer 206. Second, the resistivity of the n-type material may vary based on the direction of electron flow. A reference height direction and width direction are shown in FIG. 2. In some semiconductor materials, the electrical resistivity in the height direction is higher than the resistivity in the width direction. Thus, the electron flow 118 in FIG. 1 has high resistance when it moves through the n-layer extension 124 between the n-contact 116 and the LED mesa structure 104. By contrast, the electron flow 218 moves primarily in the lower-resistivity height direction, resulting in an overall lower resistance in the μLED 200 than the μLED 100.

FIG. 3A-3D are a series of cross sectional diagrams showing steps in the fabrication of a μLED with electroless plated contacts, according to one embodiment. FIG. 3A shows gallium nitride (GaN) layers 305 with a resist 310 deposited over a portion of the GaN layers 305. The GaN layers 305 are formed on a substrate 315. The GaN layers 305 are layers of semiconductor material that include an n-layer, p-layer, and a quantum well. In FIG. 3A, the lower portion of the GaN layers 305 (below the dotted line) is n-type GaN, and the upper portion of the GaN layers 305 (above the dotted line) is p-type GaN. The quantum well is between the n-GaN and p-GaN, in the area of the dotted line. In alternate embodiments, the layers can be constructed from one or more other semiconductor materials, such as indium gallium nitride, aluminum gallium indium phosphide, aluminum gallium phosphide, gallium arsenide, gallium arsenide phosphide, zinc selenide, or any combination of these materials such that a transparent light emitting semiconductor is formed. The substrate 315 may be an epi-wafer or other substrate that may substantially include one or more of sapphire, gallium nitride, aluminum nitride, gallium arsenide, indium phosphide, gallium phosphide and/or silicon carbide.

After the GaN layers 305 are grown, the resist 310 is deposited on top of a portion of the GaN layers 305. In some embodiments, multiple mesa structures are formed form a single set of GaN layers 305, so similar regions of resist 310 can be deposited at multiple locations across the top of the GaN layers 305. The resist 310 can be a photoresist applied to the GaN layers 305 and removed from unwanted areas using photolithography.

Figure 7A:
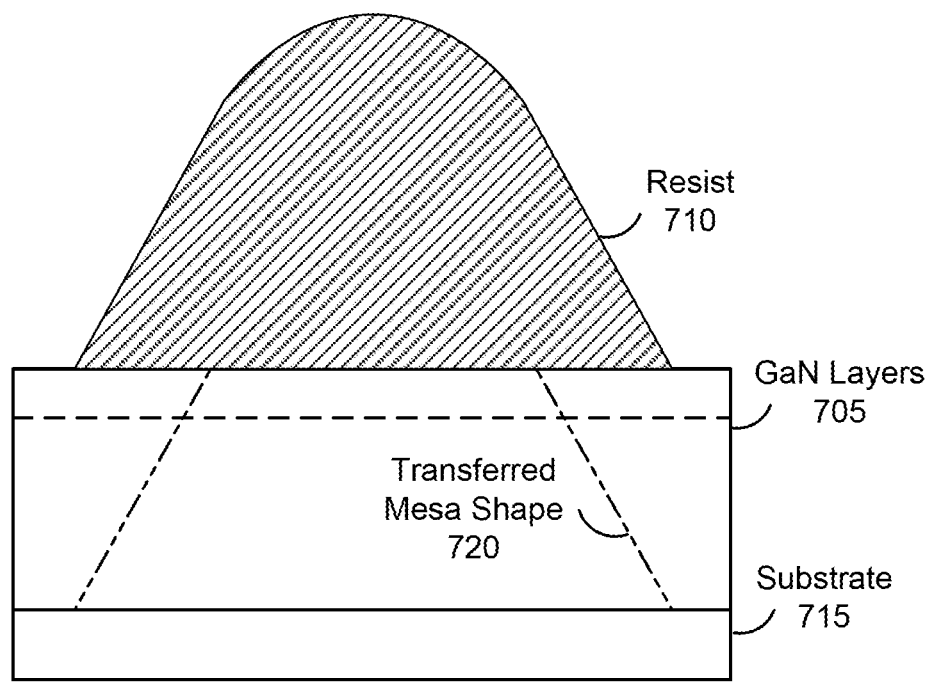
FIGS. 7A and 7B are cross sectional diagrams showing processes for etching a mesa, according to one embodiment.
Figure 7B:
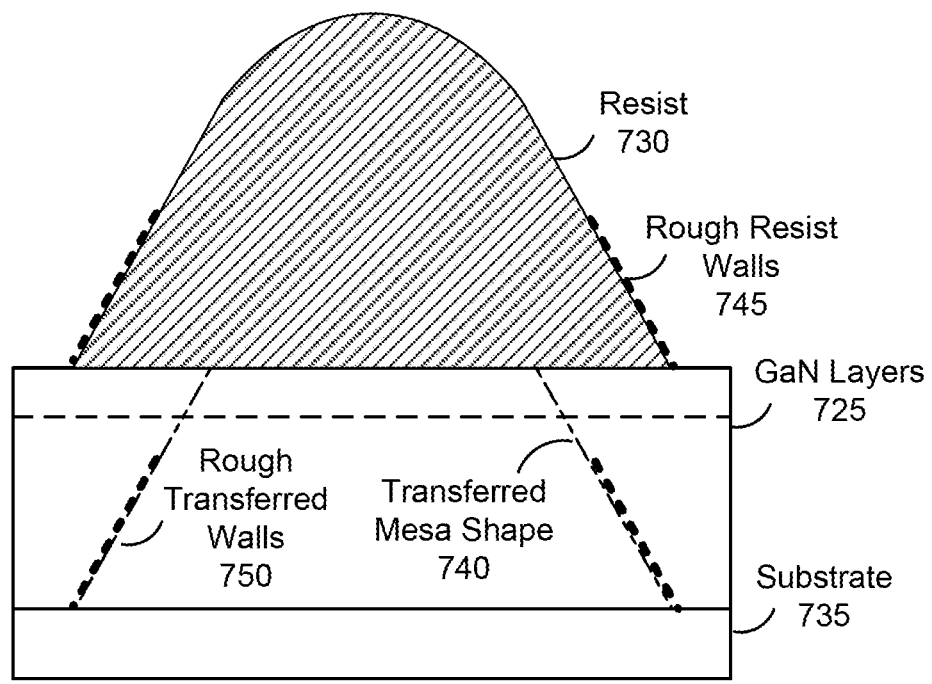

FIG. 3B shows a GaN mesa 320 formed by etching the GaN layers 305 of FIG. 3A down to the substrate 315 and removing the resist 310 after etching. The etching process results in a mesa shape with sloped sidewalls. If multiple mesa structures are formed from a single set of GaN layers 305, etching through the layers 305 through to the substrate 315 individuates each mesa structure. After the etching, the resist 310 is removed. Forming the GaN layers 305 and etching the GaN layers 305 into the mesa shape 320 is described, for example, in U.S. Pat. No. 7,598,149, which is incorporated herein by reference. Two exemplary processes for etching the GaN mesa 320 using a shaped resist are shown in FIGS. 7A and 7B.

As a result of the etching, the portion of the GaN mesa 320 that was underneath the resist 310 has a smooth surface. In some embodiments, the side of the GaN mesa 320 also has a smooth surface; in other embodiments, such as the embodiment shown in FIG. 7B, the etching produces a roughened side surface.

In an electroless plating process, a metal will selectively bond to a rough surface of the GaN mesa 320, but not to a smooth surface. As shown in FIG. 3C, the top of the GaN 325 is given a rough surface 325, and the lower side of the GaN mesa 320 is also given a rough surface 330. The rough surface 330 may extend partially or fully around the circumference or sides of the GaN mesa 320. With these top and side surfaces roughened, an n-contact can be deposited using electroless plating on the rough surface 330, and a p-contact can be deposited on the rough surface 325. A passivation layer 335 is deposited at least a portion of an area between the rough surfaces 325 and 330. The passivation layer 335 prevents the n-contact and p-contact formed at the top and side surfaces from coming into electrical contact with each other, which would result in a short. The passivation layer 335 may be formed of, for example, silicon oxide or silicon nitride, and may be on the order of 50-100 nm thick. Two exemplary processes for depositing the passivation layer 335 are described with respect to FIG. 8 and FIGS. 9A-9B.

Various techniques can be used to create the rough surface 325, or a surface suitable for electroless plating the p-contact, at the top of the GaN mesa 320. For example, a wet etching or a dry etching process can be performed after the GaN mesa 320 is formed. As another example, thermal annealing can be used to deposit a thin contact (e.g., on the order of 100 nm) at the top of the GaN mesa 320. For example, a thin layer of nickel gold may be heated and deposited on the top surface of the GaN mesa 320. The annealed layer serves as a base for depositing a p-contact. In some embodiments, wet etching, dry etching, or thermal annealing is performed on one or more selected areas of the GaN layers 305, before the GaN mesa 320 is formed. In such embodiments, the GaN mesa 320 is then formed around an etched or annealed area of the GaN layers 305.

Figure 9A:
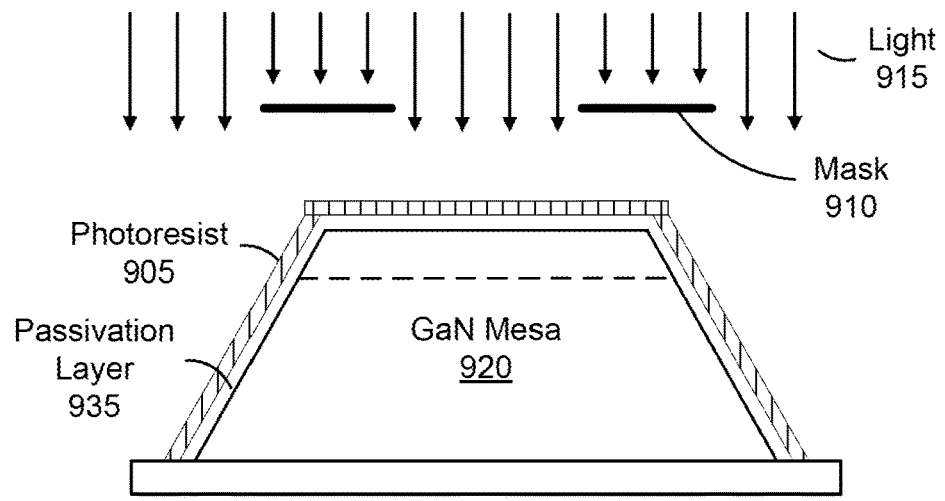
FIGS. 9A-9B are cross sectional diagrams showing a process of selectively applying a passivation layer, according to one embodiment.
Figure 9B:
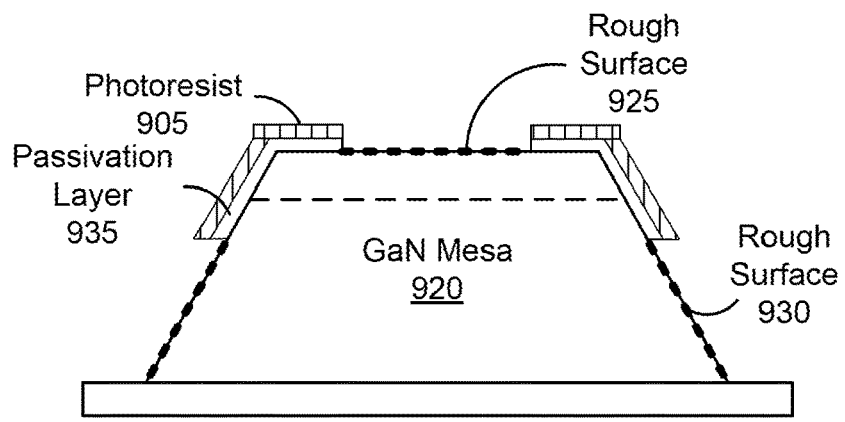

In addition, various techniques can be used to create the rough surface 330 around the base of the GaN mesa 320. For example, if the etching of the GaN mesa 320 results in smooth side walls, dry etching or wet etching can be performed to create the rough surface 330 after the initial etching of the GaN mesa 320. The rough surfaces 325 and 330 may be etched simultaneously in a single process, or in separate processes. Another example for using a shaped resist to create the rough surface 330 is shown in FIG. 7B. As another option, a photoresist process is used to roughen the sidewalls and, in some embodiments, the top surface; this process is shown in FIGS. 9A and 9B.

FIG. 3D shows the result of the electroless plating of the GaN mesa 320 having the rough surface 325 at its top and the rough surface 330 at the sides of the n-layer. In the electroless plating process, a conductor is plated on the rough surfaces 325 and 330 using a solution with a reducing agent. The deposited n-contact 340 and p-contact 345 are made of a conductive metal or alloy. As a result of the electroless plating, an n-contact 340 is formed over the rough surface 330, and a p-contact 345 is formed over the rough surface 325. Because the GaN mesa 320 is attached to the substrate 315, the bottom surface of the n-contact 340 rests on the substrate 315 and is flush with the bottom of the GaN mesa 320.

FIG. 4 is a top view of the μLED shown in FIG. 3D, according to one embodiment. As shown in FIG. 4, the n-contact 340 extends all the way around the GaN mesa 320, in shape similar to a ring or a doughnut with a flat bottom and a slanted inner side. The bottom surface of the n-contact 340 extends from the edge of the mesa base 405 towards the outer edge of the n-contact 340. While the outer surface of the n-contact 340 is shown as being rounded and smooth in FIGS. 2, 3D, and 4, the electroless plating process may cause the outer surface to be more irregular than depicted. The passivation layer 335 is not shown in FIG. 4.

Figure 5:
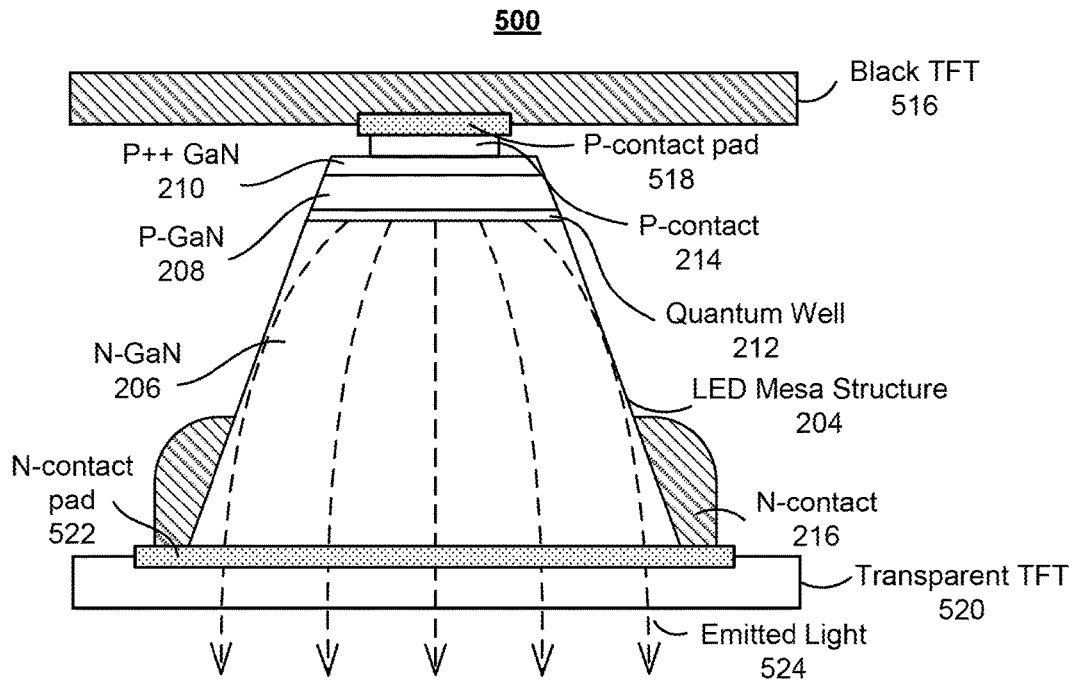
FIG. 5 is a cross sectional diagram of the μLED of FIG. 2 arranged between two circuitry substrates, according to one embodiment.

FIG. 5 is a cross sectional diagram 500 showing the μLED of FIG. 2 arranged between two circuitry substrates, according to one embodiment. The μLED shown in FIG. 5 has the same components as the μLED 500 in FIG. 5. In particular, FIG. 5 shows the LED mesa structure 204, the p-contact 214 disposed on the top of the LED mesa structure 204, and the n-contact 216 disposed around the base of the LED mesa structure 204. The LED mesa structure 204 may include, among other components, the n-layer 206, the p-layer 208, the p++ layer 210, and the quantum well 212. As mentioned above, the p++ layer 210 is optional, and other layers may be included.

FIG. 5 shows the μLED 200 attached to circuitry substrates, which are used to apply voltages to the n-contact 216 and the p-contact 214. The top circuitry substrate is a black thin film transistor (TFT) 516. The bottom circuitry substrate is a transparent TFT 520. TFTs are made by depositing thin films of an active semiconductor layer along with a dielectric layer and metallic contacts over a supporting non-conducting substrate, such as glass. TFT 516 and TFT 520 may include transistors based on amorphous silicon (A-Si), low temperature polysilicon (LTPS), or amorphous Indium Gallium Zinc Oxide (IGZO) technology, among others. The substrate sizes may range from first generation displays of around 30 cm×40 cm to larger displays, such as tenth generation displays (known as GEN 10) of around 2.88 m×3.15 m, GEN 10.5 displays of around 2.94 m×3.37 m, or larger display sizes. In some embodiments, instead of the TFT 516, TFT 520, or both TFTs 516 and 520, a back-plane may be used to connect the electrical contact to a current source.

The p-contact 214 of the μLED 200 is attached to the black TFT 516 via a p-contact pad 518. The n-contact 216 of the μLED 200 is attached to the transparent TFT 520 via an n-contact pad 522. The n-contact pad 522 may have a ring shape to match the shape of the bottom of the n-contact 216. If the n-contact pad 522 is made out of a transparent conductor, the n-contact pad 522 can extend across the bottom of the LED mesa structure 204 as well; this may allow a greater margin of error in the placement of the n-contact 216 on the n-contact pad 522. The contact pads 518 and 522 are made of a conductive material. The contact pads 518 and 522 may be formed on the μLED 200, or the contact pads 518 and 522 may be formed on their respective TFTs 516 and 520. A bonding element may be used to connect the contact pads 518 and 522 to the respective TFTs 516 and 520.

In prior μLED assemblies, such as an assembly of the μLEDs 100 in FIG. 1, the density at which the μLEDs could be arranged was limited not only by the prior arrangement of the n-contact next to the mesa, but also by the density of transistors in the TFT layer. In such prior assemblies, each μLED needed two transistors in the TFT layer—one for the n-contact 116, and one for the p-contact 114. By contrast, an assembly of the μLEDs 200 has two TFT layers—one below the n-contacts 216, and one above the p-contacts 214—and each TFT layer only includes transistor per μLED 200. Because half as many transistors are needed on the TFT layer, the μLEDs 200 can be placed with higher density.

Figure 6:
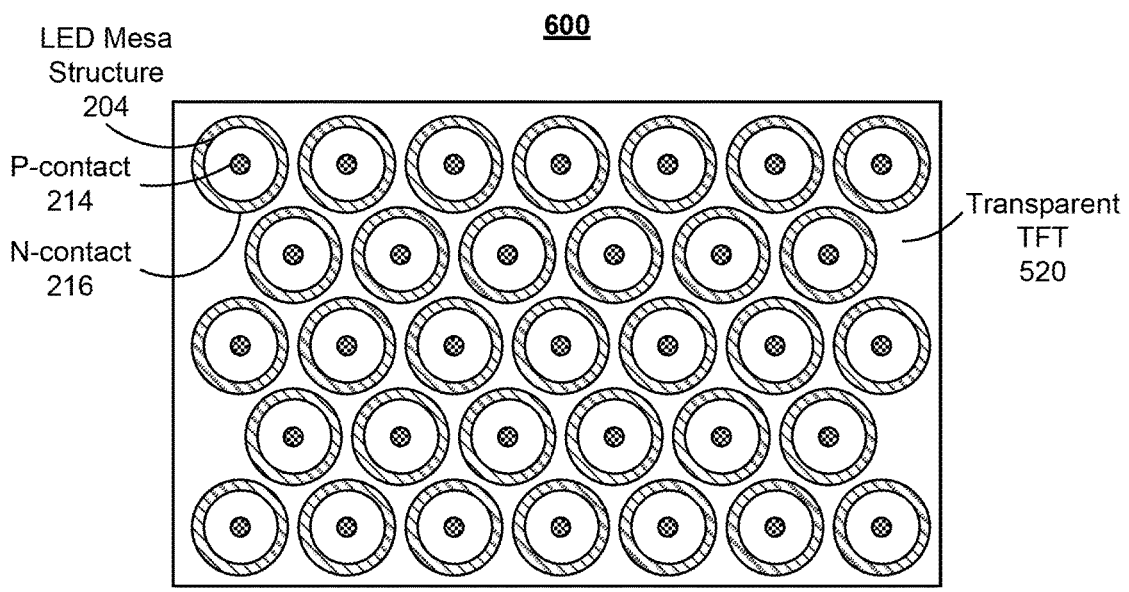
FIG. 6 is a top view of an assembly of the μLEDs of FIG. 2, according to one embodiment.

FIG. 6 is a top view of an assembly 600 of the μLEDs of FIG. 2, according to one embodiment. The assembly shows an arrangement of multiple μLEDs 200 arranged on the transparent TFT 520. The p-contact 214, LED mesa structure 204, and n-contact 216 of each μLED 200 is shown. The n-contacts 216 are shaded with diagonal lines, and the p-contacts 216 are shaded in a checkerboard pattern. P-contact pads 518 and the black TFT 516 (not shown) would be arranged on top of the assembly 600. The μLEDs 200 in assembly 600 are packed close together, with little distance between the μLEDs. This results in a dense display with a high emission. An assembled wafer can be fully populated, without losing space on the wafer to large non-emitting areas needed for separate n-contacts.

FIGS. 7A and 7B are cross sectional diagrams showing processes for etching a mesa, according to one embodiment. FIG. 7A shows one embodiment for etching a mesa with smooth sidewalls. In FIG. 7A, GaN layers 705, which are similar to the GaN layers 305 shown in FIG. 3A, are layered atop a substrate 715. A layer of dome-shaped resist 710 is applied to the top of the GaN layers 705. An etching process, such as a plasma dry etch, is used to etch the GaN layers 705; as the etchant works through the resist 710, it etches the GaN layers 705 into a transferred mesa shape 720 that reflects the shape of the resist 710. Accordingly, the sloped sides of the resist 710 are etched into the GaN layers 705 to form the transferred mesa shape 720. Any resist 710 remaining on the GaN after the etching process is complete is removed.

FIG. 7B shows another embodiment for etching a mesa with rough sidewalls. In FIG. 7B, GaN layers 725, which are similar to the GaN layers 305 shown in FIG. 3A, are layered atop a substrate 735. A layer of dome-shaped resist 730 is applied to the top of the GaN layers 725. Unlike the resist 710 of FIG. 7A, which has smooth sidewalls, the resist 730 in FIG. 7B has rough resist walls 745. When an etchant etches the GaN layers 725 to form a transferred mesa shape 740, the rough resist walls 745 are transferred to the mesa as rough transferred walls 750. The top surface of the formed mesa may have been roughened before the resist 730 was applied, or it may be roughened after any remaining resist 730 is removed. An n-contact can be formed on the rough transferred walls 750 by electroless plating, as described above.

Figure 8:
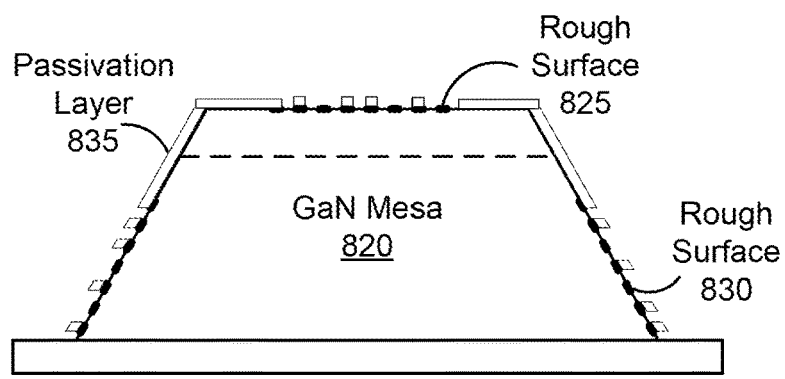
FIG. 8 is a cross sectional diagram showing a passivation layer deposited on a mesa with roughened surfaces, according to one embodiment.

FIG. 8 is a cross sectional diagram showing a passivation layer deposited on a mesa with roughened surfaces, according to one embodiment. In the embodiment shown in FIG. 8, a GaN mesa 820, similar to GaN mesa 320 shown in FIG. 3B, has a rough surface 825 at the top, and a rough surface 830 around the sidewalls. After the rough surfaces 825 and 830 are formed on the GaN mesa 820, a passivation layer 835 is deposited over the full surface of the GaN mesa 820. As shown in FIG. 8, the passivation layer 835 forms fully over the smooth walls of the GaN mesa 820, between the rough surfaces 825 and 830. However, the rough surfaces 825 and 830 prevent the passivation layer 835 from fully coating in these regions. Accordingly, an n-contact and a p-contact that is deposited on the rough surfaces 825 and 830 will be in electrical contact with the p-layer and n-layer of the GaN mesa 820.

FIGS. 9A-9B are cross sectional diagrams showing a process of selectively applying a passivation layer, according to one embodiment. In FIG. 9A, a GaN mesa 920, similar to GaN mesa 320 shown in FIG. 3B, is coated with a passivation layer 935, which is then coated with a photoresist 905. A mask 910 covers the upper corners of the GaN mesa 920, and light 915 is applied to the photoresist 910 in the area outside of the upper corners of the GaN mesa 920.

FIG. 9B shows the removal of the photoresist 905 and the passivation layer 935 in the developed area, which includes the top surface and the lower sidewalls of the GaN mesa 920. The photoresist 905 that was exposed to the light 915 is removed using a developer, and portions of the passivation layer 935 that are in the areas exposed by the removal of the photoresist 905 are removed by an etchant. In an embodiment, the etchant also etches into the GaN mesa 920, creating a rough surface 925 at the top of the GaN mesa 920 and a rough surface 930 around the side of the GaN mesa 930. This embodiment has the advantage of removing the passivation layer 935 and forming the roughened surfaces 925 and 930 in a single step. In other embodiments, the rough surface 925 and/or rough surface 930 had already been formed in the GaN mesa 920, and the etchant only removes the passivation layer 935.

Because the process shown in FIGS. 9A and 9B removes the passivation layer from the surfaces on which the p-contact and n-contact are formed, a thicker passivation layer may be created using this process than in the process described with respect to FIG. 8.

Figure 10:
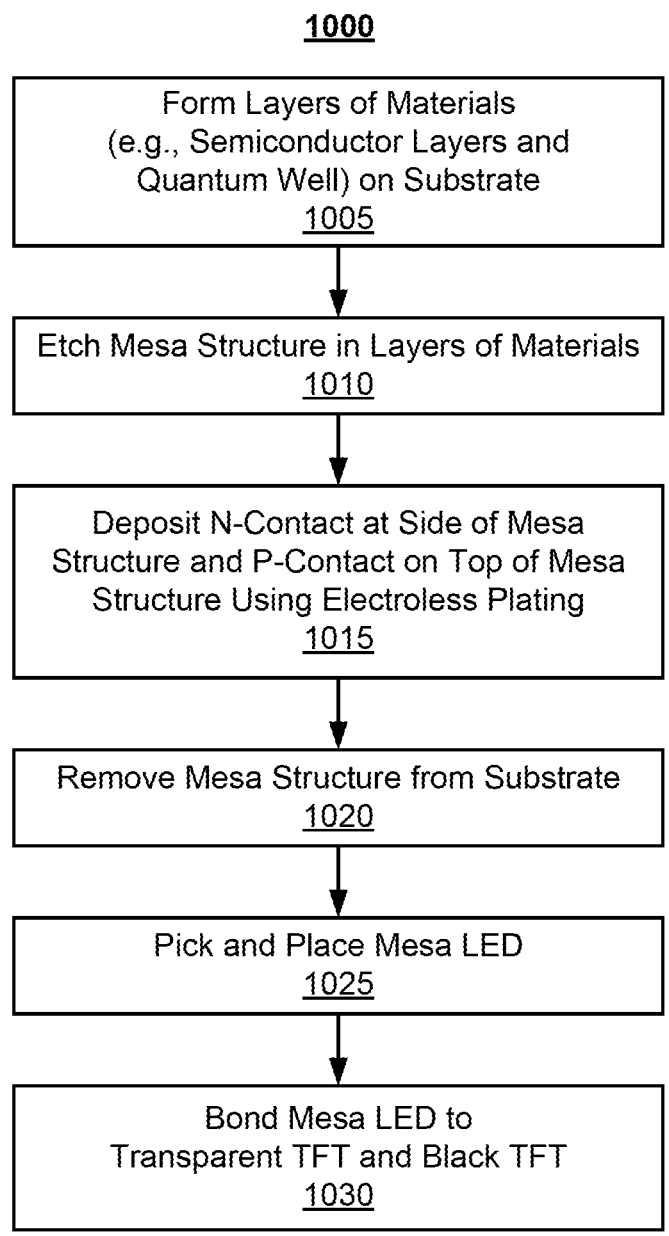
FIG. 10 is a flowchart illustrating the process for generating a μLED with electroless plated contacts, according to one embodiment.

FIG. 10 is a flowchart illustrating the process 1000 for generating a μLED with electroless plated contacts, according to one embodiment. Layers of semiconductor material and a quantum well are formed 1005 on a substrate. For example, the layers may include an n-layer 206, a p-layer 208, a p++ layer 210, and a quantum well 212 between the n-layer 206 and the p-layer 208. In some embodiments, there is a single p-layer rather than both a p-layer 208 and a p++ layer 210. The semiconductor layers may include one or more of gallium nitride, indium gallium nitride, aluminum gallium phosphide, gallium arsenide, gallium arsenide phosphide, zinc selenide, or any combination of these materials such that a transparent light emitting semiconductor is formed. The substrate may substantially include one or more of sapphire, gallium nitride, aluminum nitride, gallium arsenide, indium phosphide, gallium phosphide and/or silicon carbide.

The layers of materials on the substrate are etched 1010 into a mesa structure. The etching may be performed using standard LED fabrication techniques. Before etching, a resist is deposited on a portion of the top surface of the formed layers to prevent etching of the layers of materials. The layers of material may be etched through to the substrate. If multiple mesa structures are etched into the layers of materials, etching the layers through to the substrate individuates each mesa. After etching the mesa structure, one or more dry etching, wet etching, and/or annealing processes may be performed to roughen a portion of the top surface where the p-contact will be formed and a portion of the sidewall where the n-contact will be formed, as shown in FIG. 3C. Other exemplary processes for roughening the top surface and sidewalls, and exemplary processes for adding a passivation layer, were described with respect to FIGS. 3C and 7A-9B.

N-contacts and p-contacts are deposited 1015 on the mesa structure using electroless plating. In particular, the n-contact is plated at the side of the mesa structure, in an area around the base of the mesa, and the p-contact is plated to the top of the mesa structure. The electroless plating selectively deposits the contact material on the rough surfaces of the mesa structure.

The mesa structures with the n-contacts and p-contacts are removed 1020 from the substrate. For example, a laser lift-off (LLO) process can be applied to the GaN mesa structures to remove them from a sapphire substrate. LLO involves removing the substrate using a laser beam, such as an ultraviolet (UV) beam. The laser beam is directed through the substrate to the n-layer of the mesa structure, which causes the mesa structure to separate from the substrate. Other processes can be used to remove the mesa structure from the substrate, depending on the materials used; for example, an etch stop layer (ESL) can be deposited onto a substrate to separate the substrate from the mesa structure. In other embodiments, wet etching, dry etching, mechanical release, or thermal release techniques can be used to remove the mesa structure from the substrate.

The mesa structure is picked and placed 1025 onto transparent and black TFTs. In particular, the p-contact on the top of the mesa structure can be aligned with a p-contact pad on a black TFT, and the n-contact encircling the base of the mesa structure can be aligned with an n--contact pad on the transparent TFT.

The mesa LEDs are bonded 1030 to the transparent and black TFTs, e.g., using thermocompression bonding.

While the above embodiments were described with reference to a μLED having a p-contact at the top, a p-type region below the p-contact, an n-type region below the p-contact, and an n-contact encircling the base of the n-type region, it should be understood that the polarity of the p-region and the n-region can be reversed, such that the upper portion of the mesa is an n-type material, and the lower portion of the mesa is a p-type material. In such embodiments, the top contact of the μLED is an n-contact, and the base contact of the μLED is a p-contact.

While some of the above embodiments were described as using GaN layers for the p-type and n-type semiconductor layers, in other embodiments, other materials may be used. For example, alternate embodiments may use one or more other semiconductor materials, such as indium gallium nitride, aluminum gallium phosphide, aluminum gallium indium phosphide, gallium arsenide, gallium arsenide phosphide, zinc selenide, or any combination of these materials such that a transparent light emitting semiconductor is formed.

Upon reading this disclosure, a reader will appreciate still additional alternative structural and functional designs through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A method for fabricating a light emitting diode (LED), the method comprising:
   forming layers of materials including a first semiconductor layer, a second semiconductor layer, and a light emitting layer between the first and second semiconductor layers for producing light responsive to passing current through the light emitting layer;
   shaping the formed layers of material to comprise a bottom surface, a top surface having an area smaller than an area of the bottom surface, and a sloped sidewall extending from the bottom surface to the top surface, wherein the bottom surface is a first surface of the first semiconductor layer, and the top surface is a first surface of the second semiconductor layer;
   forming a passivation layer on a first portion of the sloped sidewall, wherein the first portion comprises a second surface of the second semiconductor layer and a surface of the light emitting layer;
   roughening a second portion of the sloped sidewall, the second portion comprising a second surface of the first semiconductor layer; and
   selectively depositing a first electrical contact on the roughened second portion of the sloped sidewall and in contact with the first semiconductor layer.

2. The method of claim 1, comprising depositing the first electrical contact with an electroless plating process.

3. The method of claim 2, further comprising roughening a portion of the top surface by one of dry etching, wet etching, and annealing.

4. The method of claim 3, further comprising depositing a second electrical contact on the roughed portion of the top surface with the electroless plating process.

5. The method of claim 1, wherein shaping the formed layers of material comprises performing an etching process to individuate the formed layers.

6. The method of claim 5, wherein the etching process to individuate the formed layers roughens the roughened second portion of the sloped sidewall.

7. The method of claim 5, wherein shaping the formed layers of material comprises etching the layers of materials into a mesa, and a side encircling the mesa is the sloped sidewall.

8. The method of claim 1, wherein the first electrical contact is deposited with the bottom surface attached to a fabrication substrate on which the layers of materials are formed.

9. The method of claim 8, further comprising detaching the shaped layers of material with the first electrical contact from the fabrication substrate.

10. The method of claim 9, further comprising:
    aligning the detached layers of material to a circuitry substrate; and
    connecting the first electrical contact to a contact pad on the circuitry substrate.

11. The method of claim 10, wherein the circuitry substrate is transparent.

12. A light emitting diode (LED) comprising:
    layers of materials comprising:
      a first semiconductor layer comprising a bottom surface of the LED,
      a second semiconductor layer comprising a top surface of the LED, the top surface having an area smaller than an area of the bottom surface, and
      a light emitting layer between the first semiconductor layer and the second semiconductor layer for producing light responsive to passing current through the light emitting layer, wherein the layers of materials have a sloped sidewall extending from the bottom surface to the top surface, the sloped sidewall having a roughened first portion on the first semiconductor layer;
    a passivation layer formed on a second portion of the sloped sidewall, the second portion comprising a surface of the second semiconductor layer and a surface of the light emitting layer; and
    a first electrical contact selectively deposited on the roughened first portion of the sloped sidewall, the first electrical contact encircling and in contact with the first semiconductor layer.

13. The LED of claim 12, wherein the layers of material are formed into a mesa shape.

14. The LED of claim 12, wherein the first electrical contact is proximate to the bottom surface.

15. The LED of claim 12, wherein the first electrical contact is deposited by an electroless plating process.

16. The LED of claim 12, wherein the bottom surface has a non-circular shape.

17. The LED of claim 12, further comprising:
    a circuitry substrate having a first contact pad connected to the first electrical contact.

18. The LED of claim 12, further comprising a second electrical contact on the top surface.

19. The LED of claim 18, wherein the first semiconductor layer comprises an upper portion and a lower portion, and the first electrical contact is in contact with and encircles the lower portion of the first semiconductor layer, and the second electrical contact is not in contact with and does not encircle the upper portion of the first semiconductor layer.

* * * * *